(12) United States Patent
Claverie

(10) Patent No.: US 6,598,002 B1
(45) Date of Patent: Jul. 22, 2003

(54) METHOD AND DEVICE FOR TESTING ELECTRONIC EQUIPMENT

(75) Inventor: Serge Claverie, Antony (FR)

(73) Assignee: Sextant Avionique, Velizy Villacoublay (FR)

( * ) Notice: Subject to any disclaimer, the term of this patent is extended or adjusted under 35 U.S.C. 154(b) by 0 days.

(21) Appl. No.: 09/424,251

(22) PCT Filed: May 29, 1999

(86) PCT No.: PCT/FR98/01092

§ 371 (c)(1),
(2), (4) Date: Nov. 30, 1999

(87) PCT Pub. No.: WO98/54587

PCT Pub. Date: Dec. 3, 1998

(30) Foreign Application Priority Data

May 30, 1997 (FR) .............................. 97 06684

(51) Int. Cl.⁷ ............................................. G06F 19/00
(52) U.S. Cl. ............................ 702/68; 702/121; 714/46
(58) Field of Search ............................ 702/57, 66–71, 702/73, 74, 108, 109, 117, 118, 120, 121, 122–124, 183, 185, 186, 188, 189; 324/539; 345/440, 520; 703/13; 714/46

(56) References Cited

U.S. PATENT DOCUMENTS

| | | | | |
|---|---|---|---|---|
| 4,393,498 A | * | 7/1983 | Jackson et al. ............... | 714/46 |
| 4,943,919 A | * | 7/1990 | Aslin et al. ................... | 701/3 |
| 5,036,479 A | * | 7/1991 | Prednis et al. ............... | 702/121 |
| 5,111,402 A | * | 5/1992 | Brooks et al. ................ | 701/35 |
| 5,184,312 A | * | 2/1993 | Ellis ........................... | 702/121 |
| 6,151,567 A | * | 11/2000 | Ames et al. .................. | 703/13 |
| 6,230,109 B1 | * | 5/2001 | Miskimins et al. ......... | 702/109 |

* cited by examiner

*Primary Examiner*—Marc S. Hoff
*Assistant Examiner*—Mohamed Charioui
(74) *Attorney, Agent, or Firm*—Oblon, Spivak, McClelland, Maier & Neustadt, P.C.

(57) ABSTRACT

A process for testing an electronic equipment linked to a computer coupled to a data entry and display console with a screen, effecting an interface with an operator. The test includes a list of commands to be executed. The process displays a test chart on the screen, made up of groups of cells, a group being associated with a command. For at least one command, its group of cells includes a cell which is to be supplied with a label of the command, a cell which is to be supplied with an expected result of the command, a cell which is reserved for an actual result of the command, and a cell which is reserved for the result of a comparison between the actual result and the expected result. Further, the process displays, after the execution of the command, the actual result and the result of the comparison. Such a process may find particular application to tests of various modules of an aircraft whether they take place in the design, production, or exploitation phase.

31 Claims, 7 Drawing Sheets

| STEP No. C1 | COMMAND TYPE C2 | VARIABLES AND PARAMETERS OF THE COMMAND C3 | EXPECTED RESULT C4 | ACTUAL RESULT C5 | RESULT C6 |
|---|---|---|---|---|---|
| 150 | MEASURE VOLTAGE | AC between ANI_2_16_V2 and ANI2_16_V0 | [-3:3]mV | 2 mV | PASS |
| --- | --- | --- | --- | --- | --- |
| 230 | READ CENTRAL UNIT | Path A alongside COM address MANA_V1 | FFh | FEh | FAIL |
| --- | --- | --- | --- | --- | --- |
| 400 | APPLY ANI_2 | --- | | | |
| 450 | APPLY PWS | Voltage 28V current 5A on path A | | | |

FIG.2

| AN/2 | | | | |
|---|---|---|---|---|
| AIRCRAFT NAME | PIN | HARDWARE NAME | SIGNAL No. | TEST BED |
| LH_OUTB_MFS_POSIT_VA | B03K | ANI2_01_V1 | 121 | MFS_RVDT+1 |
| LH_OUTB_MFS_POSIT_V0 | B03J | ANI2_01_V0 | 122 | MFS_RVDT-REF 1 |
| LH_OUTB_MFS_POSIT_VB | B03H | ANI2_01_V2 | 123 | MFS_RVDT-1 |
| LH_INB_MFS_POSIT_VA | E05E | ANI2_03_V1 | 126 | MFS_RVDT+2 |
| LH_INB_MFS_POSIT_V0 | E05D | ANI2_03_V0 | 127 | MFS_RVDT-REF 2 |
| LH_INB_MFS_POSIT_VB | E05C | ANI2_03_V2 | 128 | MFS_RVDT-2 |
| HSTA_POSIT_own_C_VA | E09E | ANI2_05_V1 | 131 | HST_RVDT+1 |
| HSTA_POSIT_own_C_V0 | E09D | ANI2_05_V0 | 132 | HST_RVDT-REF 1 |
| HSTA_POSIT_own_C_VB | E09C | ANI2_05_V2 | 133 | HST_RVDT-1 |
| HSTA_POSIT_opp_M_VA | B09K | ANI2_06_V1 | 136 | HST_RVDT+2 |
| HSTA_POSIT_opp_M_V0 | B09J | ANI2_06_V0 | 137 | HST_RVDT-REF 2 |
| HSTA_POSIT_opp_M_VB | B09H | ANI2_06_V2 | 138 | HST_RVDT-2 |
| RH_OUTB_MFS_POSIT_VA | B01K | ANI2_02_V1 | 145 | MFS_RVDT+3 |
| RH_OUTB_MFS_POSIT_V0 | B01J | ANI2_02_V0 | 146 | MFS_RVDT-REF 3 |
| RH_OUTB_MFS_POSIT_VB | B01H | ANI2_02_V2 | 147 | MFS_RVDT-3 |
| RH_INB_MFS_POSIT_VA | E01E | ANI2_04_V1 | 148 | MFS_RVDT+4 |

FIG.3

| STEP No. | COMMAND | VARIABLES AND PARAMETERS OF THE COMMAND | EXPECTED RESULT | ACTUAL RESULT |
|---|---|---|---|---|
| 10 | SWITCH ON CONTROL POST | FGCP into VAR 1 | [100:200]mV | |
| 20 | DEADLINE | 200 ms | | |
| 30 | MANUAL ACTION | Set IAS to the ON state. | | |
| 40 | DEADLINE | 200 ms | | |
| 50 | MANUAL ACTION | Set VS to the ON state. | | |
| 60 | DEADLINE | 200 ms | | |
| 70 | MANUAL ACTION | Set VNAV to the ON state. | | |
| 80 | DEADLINE | 200 ms | | |
| 90 | MANUAL ACTION | Set ALT to the ON state. | | |
| 100 | DEADLINE | 200 ms | | |
| 110 | MANUAL ACTION | Set ALTSEL to the ON state. | | |
| 120 | DEADLINE | 200 ms | | |
| 130 | MANUAL ACTION | Set HDG to the ON state. | | |
| 140 | DEADLINE | 200 ms | | |
| 150 | MANUAL ACTION | Set NAV to the ON state. | | |
| 160 | DEADLINE | 200 ms | | |
| 170 | MANUAL ACTION | Set APPR to the ON state. | | |
| 180 | DEADLINE | 200 ms | | |
| 190 | MANUAL ACTION | Set BC to the ON state. | | |
| 200 | DEADLINE | 200 ms | | |
| 290 | MANUAL ACTION | Set COURSE G to state + 1. | | |
| 300 | DEADLINE | 200 ms | | |
| 310 | MANUAL ACTION | Set COURSE G to state - 1. | | |
| 320 | DEADLINE | 200 ms | | |
| 330 | MANUAL ACTION | Set COURSE D to state + 1. | | |
| 340 | DEADLINE | 200 ms | | |
| 350 | MANUAL ACTION | Set COURSE D to state - 1. | | |
| 360 | DEADLINE | 200 ms | | |
| 550 | MANUAL ACTION | Set HDGD to state - 1. | | |
| 560 | DEADLINE | 200 ms | | |
| 570 | MANUAL ACTION | Set ALTG to state + 1. | | |
| 580 | DEADLINE | 200 ms | | |
| 590 | MANUAL ACTION | Set ALTG to state - 1. | | |
| 600 | DEADLINE | 200 ms | | |
| 610 | SWITCH OFF CONTROL POST | FGCP | | |

FIG. 5b

METHOD AND DEVICE FOR TESTING ELECTRONIC EQUIPMENT

BACKGROUND OF THE INVENTION

1. Field of the Invention

The present invention relates to a process and a device for testing electronic equipments, more especially intended to be used in the field of avionics for testing the modules of an aircraft, these modules being driven by at least one computer.

2. Discussion of the Background in the production phase, the electronic equipments of aircraft must successfully pass, contractually, acceptance tests before they can be placed on the market. These tests are known by the initials ATP standing for "Acceptance Test Procedure".

In the exploitation phase, the electronic equipments must also undergo tests, when a defect is detected, so as to identify the fault and locate the component or components responsible. These electronic equipments having a relatively long lifetime, of the order of twenty years, they are also required to pass validation tests so as to verify that they still meet the regulations in force. These regulations change as a function of technological advances.

In the design phase, the constructor is required to perform tests so as to verify that the equipment under construction does indeed possess the expected functionalities and that the electronic equipment interacting with others meets the specifications properly.

In the design and production phase the tests take place at the constructor's premises and in the exploitation phase they may take place at the constructor's premises if the electronic equipment is removed from the aircraft and returned or in approved test stations possessed by the main airline companies.

These various tests are steps which are absolutely necessary in a field where a very high level of safety is required.

In the course of its life, an electronic equipment will undergo several tests with the aid of different test devices, according to which phase it is in, without there being any link between the various test devices and between the results of past tests and of the test in progress.

SUMMARY OF THE INVENTION

Likewise, a particular test device will be used to independently test several similar equipments which are in the same phase of their existence. For each equipment, the results of the test are saved, but there is no interactivity between the results of the tests undergone by several similar electronic equipments.

A conventional test device includes an interpreter linked to a test bed itself linked to the electronic equipment. The test device receives, in machine language, a list of commands or test specifications. The test device, on the basis of these commands, drives the test bed which applies stimuli to the electronic components of the equipment and performs measurements. An operator checks whether these measurements correspond to the anticipated result. Multimeter oscilloscopes or other measuring apparatuses are available to the operator.

In the event of a defect, several series of complementary tests are available to attempt to detect the origin of the defect.

The list of machine language commands is compiled by a coder operator on the basis of a list of commands in a more elaborate language familiar to the technician requesting the test. The technicians have their own discipline-specific languages.

The risks of introducing errors, especially of syntax, into the test programs while they are being written in elaborate language and/or while they are being coded are not negligible and the time for setting up a test is often very long by virtue of the numerous corrections, flaws being detected only when the whole test has been run.

In the field of avionics, the activity of testing is an activity which is absolutely necessary but it is very expensive since several types of test devices coexist, since human intervention is an important factor, and since in the event of a defect, numerous investigations are generally undertaken before the cause thereof can be detected.

The present invention aims to reduce the costs of the testing activity by proposing a single test device which is capable of carrying out the tests of an electronic equipment throughout its existence. This test device is easy to use since the operator performing the test can talk to it in his own language. Transcoding is eliminated and set-up time reduced since the test can be executed command by command.

More precisely the present invention proposes a process for testing an electronic equipment linked to a computer coupled to a data entry and display console with a screen effecting an interface with an operator. A test comprises a list of commands to be executed. It consists in displaying a test chart on the screen, made up of groups of cells, a group being associated with a command. For at least one command, the associated group of cells includes a cell which is to be supplied with a label of the command, a cell which is to be supplied with an expected result of the command, a cell which is reserved for an actual result of the command, a cell which is reserved for the result of a comparison between the actual result and the expected result.

It thereafter consists in displaying, after the execution of the command, the actual result and the result of the comparison.

To simplify input, each label can be associated with a command type and the group of cells can include a cell to be supplied with the command type, the supplying of this cell causing the associated label to appear in the cell of the group to be supplied with the label.

To save time and make input more reliable, selecting a cell to be supplied with the command type can afford access to a dictionary containing a list of command types and for each type the associated label.

A label includes at least one argument and an argument is either of parameter type, independent of the equipment to be tested, or of variable type, dependent on the equipment to be tested.

To further facilitate input, in the event of selecting a cell to be supplied with a label, having an argument of variable type, the process can authorize access to a database associating the variable with the different values which it can take.

To allow an operator regardless of his speciality to carry out the test, the values of a variable are expressed differently according to an identifier chosen by an operator, this identifier depending on the speciality of the operator.

To facilitate the identification of syntax errors and of defective commands, the group of cells furthermore includes a cell to be supplied with a step of the command.

It is beneficial to be able to save the contents of the cells of a group after the execution of a command. Processing can be performed on the basis of the saves.

In the event of a difference between the actual result and the expected result of a command, it is advantageous to have available at least one complementary test contained in a library of complementary tests.

Access to a fault-locating database may be provided. This database groups together saves of commands relating to electronic equipments previously tested, at least one zone of which exhibited a defect, and establishes a link between the defective zone and at least one command for which a difference exists between the actual result and the expected result.

Certain electronic equipments require the intervention of the operator to carry out the test. The process then consists in displaying on the screen a representation of at least one part of the equipment to be tested and in signalling to the operator the intervention to be carried out by depicting it on the representation.

The present invention also relates to a device for testing an electronic equipment including a computer linked to the electronic equipment, coupled to a data entry and display console with a screen effecting an interface with an operator. The screen displays a test chart with, for at least one command, a group of cells which includes amongst them a cell to be supplied with a label of the command, a cell to be supplied with an expected result of-the command, a cell reserved for an actual result of the command, a cell reserved for the result of a comparison between the actual result and the expected result and means for displaying the actual result and the result of the comparison.

BRIEF DESCRIPTION OF THE DRAWINGS

Other characteristics and advantages of the invention will become apparent on reading the following description illustrated by the figures which represent:

FIG. 3 an example of the various values of the variable ANI2 according to its identifiers;

FIG. 5b a partial test chart corresponding to the testing of the part represented in FIG. 5a.

DESCRIPTION OF THE PREFERRED EMBODIMENTS

Figure 1:
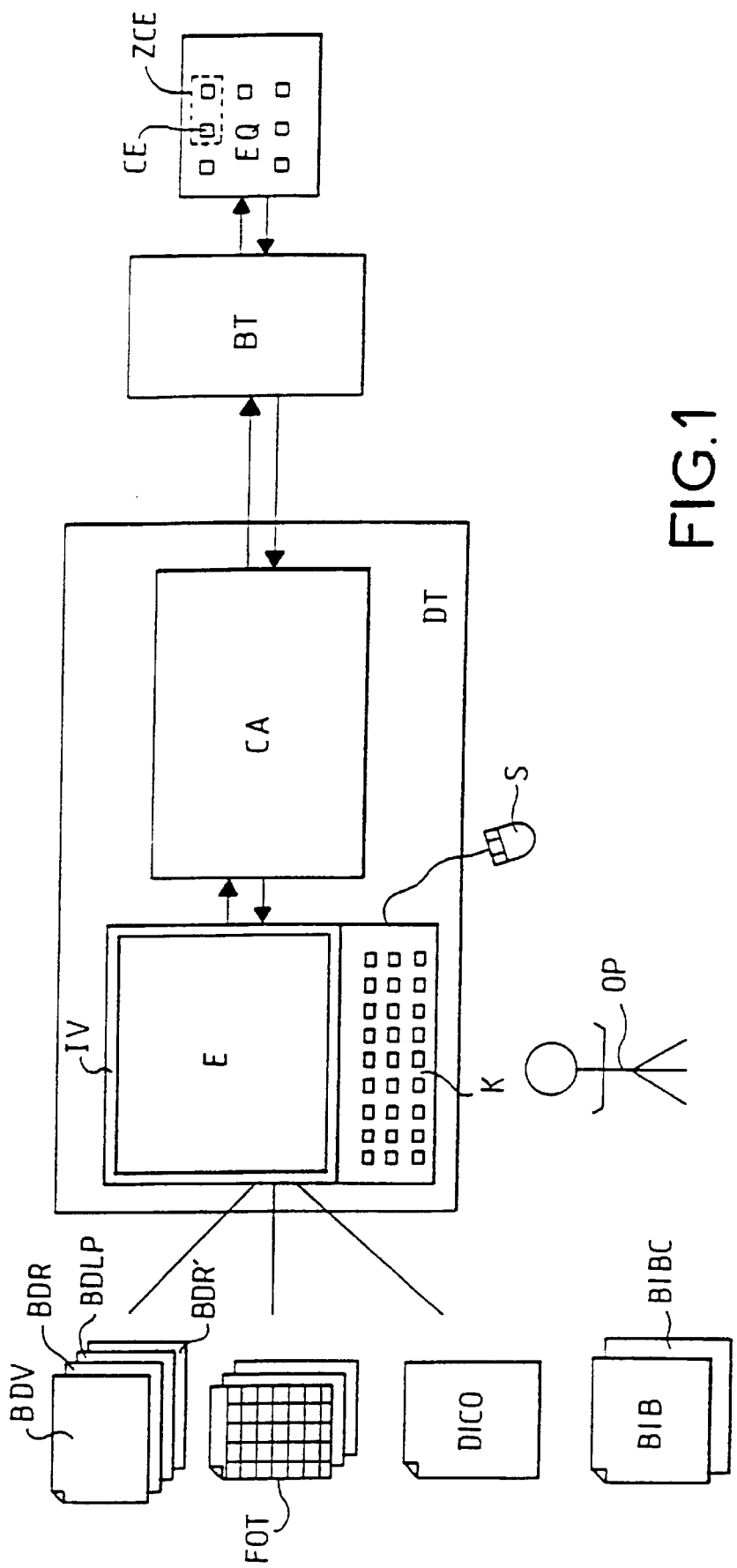
FIG. 1 a diagram of an exemplary test device according to the invention in its environment, FIG. 2 an exemplary test chart after the execution of the commands.

FIG. 1 diagrammatically represents a test device DT in accordance with the invention. This test device DT is intended to carry out tests on electronic equipments EQ and in particular to test the computers of an aircraft or the various parts of its control post.

The test device DT includes a computer CA linked to the electronic equipment EQ and coupled to a data entry and display console IV which serves as an interface with an operator OP. The operator OP talks to the test device DT by way of the console IV. This console IV conventionally includes a display screen E and a keyboard K and/or a mouse S for data entry. In the example represented the link between the electronic equipment EQ and the test device DT is effected by a test bed BT.

At the start of the preparation phase of the test, the screen E of the display console IV presents a blank test chart FOT comprising several groups of cells C1 to C6. A group of cells C1 to C6 is associated with a command. Each of these cells C1 to C6 represents a specific field of the command.

FIG. 2 diagrammatically represents a filled-in test chart FOT, after running the test. In the example shown, the cells C1 to C6 of a group are laid out in rows but they could be laid out in columns.

For at least one command, its group of cells includes a cell C3 to be supplied with a label of the command, a cell C4 to be supplied with an expected result of the command, a cell C5 reserved for the actual result of the command, a cell C6 reserved for the result of a comparison between the actual result and the expected result.

A command label is associated with a command type, it is advantageous to provide within the group, a cell C2 to be supplied with the type of the command.

The cell C3 to be supplied with the label of the command can extend over several rows of the screen E.

It is advantageous to provide within the group of cells C1 to C6, a cell C1 for numbering the command or test step. This step can be used to easily tag any syntax error or a defective command.

The pointer of the screen E allows the operator OP to select a cell to be supplied and to input its contents with the aid of the keys of the keyboard K and/or of the mouse S.

There are two categories of commands. Into the first category come the so-called "indicator" commands, they consist for example in carrying out a measurement or a read, for example MEASURE VOLTAGE or READ CENTRAL UNIT. This command type is manifested through an actual result. A test possesses at least one command of this category.

Into the second category come the so-called "control" commands consisting in applying a signal or a stimulus to the equipment under test, for example APPLY ANI-2, APPLY PWS. This command type does not call directly for any return from the test device but is generally followed by an "indicator" command.

The inputting of a command type into a cell C2 of a group can be manual, but it is far preferable to use the services of a dictionary DICO which has been previously loaded into the test device DT. This dictionary DICO contains a list of the various command types applicable to the equipment EQ having to be tested. The use of the dictionary DICO saves time, simplifies the intervention of the operator and prevents the introduction of syntax errors which are always lengthy to correct.

The associated label includes one or more arguments with a predefined syntax. The dictionary DICO contains for each command type its associated label.

The inputting into a cell C2 of a command type causes the label of the command input to appear in the corresponding cell C3. The test device includes means for displaying the associated label in the cell C3 of the group after the supplying of the type of the command. The arguments of the label are to be completed by the operator OP.

The following list gives four examples of command type and for each type, the syntax of the associated label.

| | | |
|---|---|---|
| APPLY PWS | → | voltage (VOLTAGE)V current (CURRENT)A on path (PATH) |
| CONNECT DSI | → | (EARTH/28V) on <DSI_REF> |
| MEASURE VOLTAGE | → | (AC/DC) between <SIG+> and <SIG−> |
| APPLY ANI2 | → | <ANI2_VO_REF> V1 = (VOLTAGE)V and V2 = (VOLTAGE)V |

Two types of argument are provided in a command label.

The parameters are independent of the equipment EQ to be tested. A parameter can, for example, represent a numerical value of a voltage to be applied, of a current to be passed, the value of a deadline to be complied with, the type AC or DC of a current, etc.

In the syntax associated with the arguments of a command, a parameter can be inserted between two brackets "(", ")", for example. The operator inputs the parameter with the aid of the keyboard K after having placed the pointer of the screen E in the appropriate bracket.

The variables depend on the electronic equipment EQ to be tested. A variable can represent, for example, a signal name, a selftest name, a software address attached to a selftest of the electronic equipment EQ to be tested. In the syntax associated with the arguments of a command, a variable can be inserted between two angle brackets "<", ">" for example.

The operator inputs a variable, with the aid of the keyboard K and/or of the mouse S after having placed the pointer of the screen E between the two appropriate angle brackets.

Provision is advantageously made for the variables to be catalogued in at least one database BDV associated with the equipment to be tested EQ. This database BDV facilitates input, saves time and avoids the introduction of syntax errors.

The database BDV groups together the variables contained in the arguments of the commands, especially those loaded into the dictionary DICO and for each variable the values which it can take.

These values are expressed differently according to an identifier which corresponds to the language of the operator; this language depends on his/her discipline.

As shown by the table of FIG. 3, the variable ANI2 which represents a signal type, can take the values of the first column in aircraft language during the maintenance phase, the values of the second column which represent connector pins, the values of the third column in hardware language, the values of the fourth column which represent signal numbers and finally the values of the fifth column in a language intended for the test bed BT. The various values in one and the same row are equivalent.

By selecting the cell C4 of a group, the operator can input, if need be, the expected result of the command. This result can be input in the form of an exact value or of a range of values lying between angle brackets. The expected result is accompanied by a unit or, in the case of an address expressed in terms of a hexadecimal base, by the letter h.

In FIG. 2, the expected result at step 150 is a voltage lying between −3 and 3 millivolts while that of step 230 is an address equal to FF in the hexadecimal base.

The step number of the command is input by the operator after having placed the pointer in the corresponding cell C1.

After the execution of the command for which at least cells C2 to C4 have been input, the test device DT displays the actual result in the cell C5 of the group and then compares the actual result with the expected result so as to determine whether the command has run correctly. The result of the comparison or of the test step is displayed in the corresponding cell C6 reserved for the result. During the running of the test all these commands are executed sequentially regardless of the result of the comparison.

The result of the test step can be symbolized, for example, by the terms PASS or FAIL.

The term PASS is used when the actual result is equal to the expected result or lies within the range. The term FAIL is used when the actual result is different from the expected result or lies outside the range.

The test device DT can be equipped with a text editor which offers the operator functions allowing the test instruction to be written more easily while reducing errors.

Figure 4A:
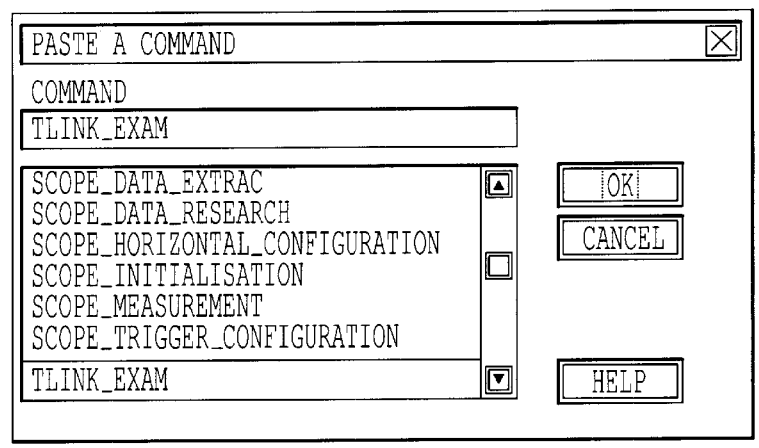
FIG. 4a an exemplary window appearing when the "paste a command" function is activated.

One of its functions dubbed "paste a command" is activated when the pointer of the screen E is in a cell C2 to be supplied with the command type and when the operator activates an appropriate key of the mouse S or of the keyboard K. A dialogue window appears and proposes a dropdown list of all the command types contained in the dictionary DICO. An exemplary window is represented in FIG. 4a.

If the cell C2 selected is already written to, a conflict will appear and the test device DT detects it. In the event of a conflict, the operator is warned thereof, for example, by video inversion of the command which is the subject of the conflict and the test editor function proposes either the insertion of the new command before the one already written, or the replacement of the command already written by the new one.

Figure 4B:
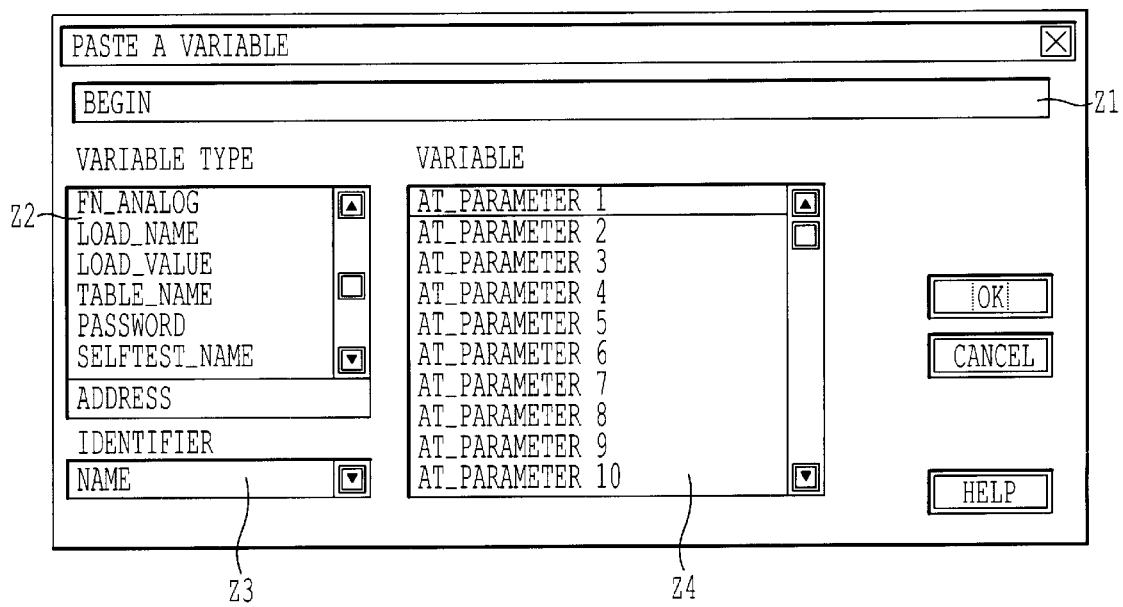
FIGS. 4b, 4c two exemplary windows appearing when the "paste a variable" function is activated as a function of the chosen identifier.
Figure 4C:
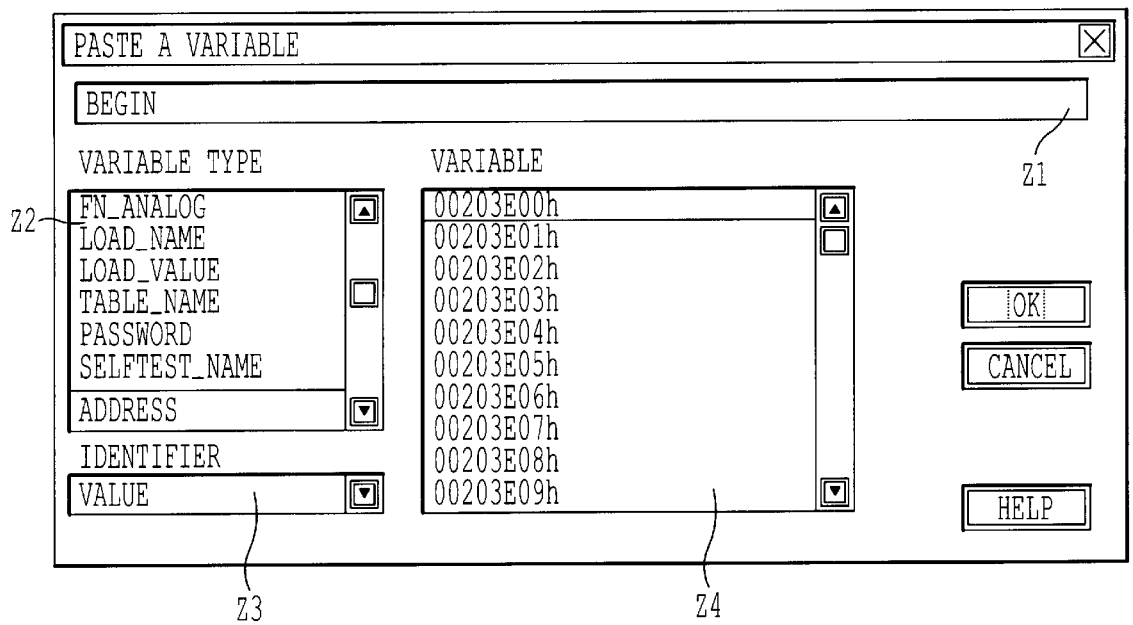

When the command type is input, the label of the command is written to the corresponding cell C3 and the text editor opens a window dubbed "paste a variable" such as one of those represented in FIGS. 4b and 4c. In a first zone Z1, this window exhibits the label of the current command and this label includes at least one argument. By positioning the pointer of the screen E in this zone Z1, the operator can, if necessary, input a parameter. In a second zone Z2, this window exhibits a dropdown list of all the variable types declared in respect of the equipment EQ to be tested.

The identifiers appear in a third zone Z3 of the window in the form of a dropdown list. In the example represented in FIG. 4b, the variable type dubbed ADDRESS can be expressed in the form of a name or as illustrated in FIG. 4c in the form of a value.

In a fourth zone Z4, the window exhibits a dropdown list of the various values which can be taken by the variable type selected as a function of the chosen identifier. The values of a variable are expressed differently according to the identifier chosen by the operator.

Figure 4D:
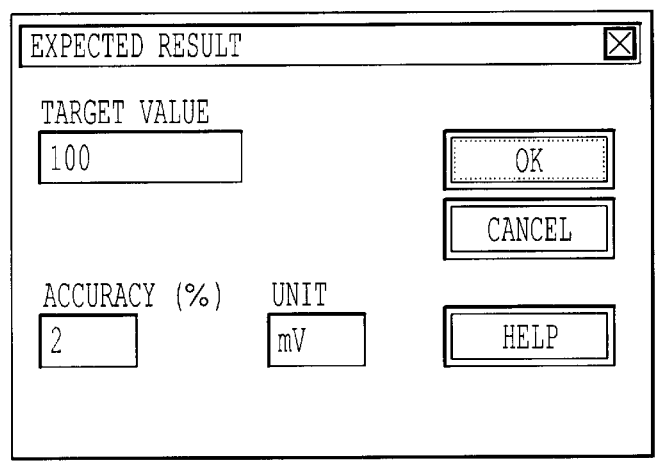
FIG. 4d an exemplary window appearing when the "paste the expected result" function is activated.

By selecting, if the command type input so demands, the cell C4 of the group and by activating the text editor, a dialogue window dubbed "expected result" appears. This window, represented in FIG. 4d, includes the value of the expected result, the accuracy involved and the unit.

The operator can thereafter execute, via the test device DT, the command input. The test device DT displays in cell C5 of the group the actual result and in cell C6 the result of the comparison.

It is beneficial to archive the results of the test at the end of the test. To do this the test device DT includes at least one database BDR reserved for the contents of the cells of a group. This archiving opens up the possibility of carrying out subsequent processing of the archived results. This archiving is contractual for ATP tests but in the existing test devices no possibility of processing has been provided for.

The test device DT can also provide for a syntactic analysis function which detects any syntax errors in what has been input. In the event of an error, this function produces an error message which locates the error. This syntactic analysis function checks whether the command type belongs to the dictionary DICO, whether the arguments have a syntax which corresponds to that contained in the dictionary DICO and whether the variables input belong to one of the databases BDV. The operator can then correct his/her error.

The test device DT can also include a function for locating a fault with the electronic equipment EQ under test.

This function can be activated when a "FAIL" message has appeared on completion of the execution of a command.

This function makes it possible to determine on the electronic equipment EQ under test, especially on the basis of the defective test step, a fault-suspect zone ZCE of the electronic equipment.

The test device DT then includes a fault-locating database BDLP which indexes the results of the tests previously run on other equipments for which faults have appeared. A link is created between a defective test step, the command type and the equipment zone called into question.

This database BDLP is enhanced in tandem with the use of the test device DT and the saving of the test results.

This locating is carried out by performing an enquiry on the basis of the defective step.

In order to determine more finely within the zone ZCE the faulty electronic component CE, it is advantageous for the operator to have at his/her disposal one or more complementary tests which the defective electronic equipment EQ is made to undergo.

It is possible to provide a library BIBC of complementary tests which holds complementary tests and this library BIBC is augmented in tandem with the use of the test device with new complementary tests. Here again, a complementary test is linked to a defective test step and to a defective command type.

The library BIBC is accessible to the operator regardless of his speciality.

The results of the complementary tests can also be saved in the database of results BDR or in a database BDR' specific to the results of the complementary tests.

The test device DT can include means for processing the contents of the cells saved in at least one of the databases BDR, BDR'. It is beneficial to be able to undertake varied statistical analyses. The determination of the most frequent fault in a given electronic component may require, for example, the modification of an electronic component or a circuit part in future electronic equipments of the same type. These statistical analyses are also very useful especially for improving the control of manufacturing processes.

Figure 5A:
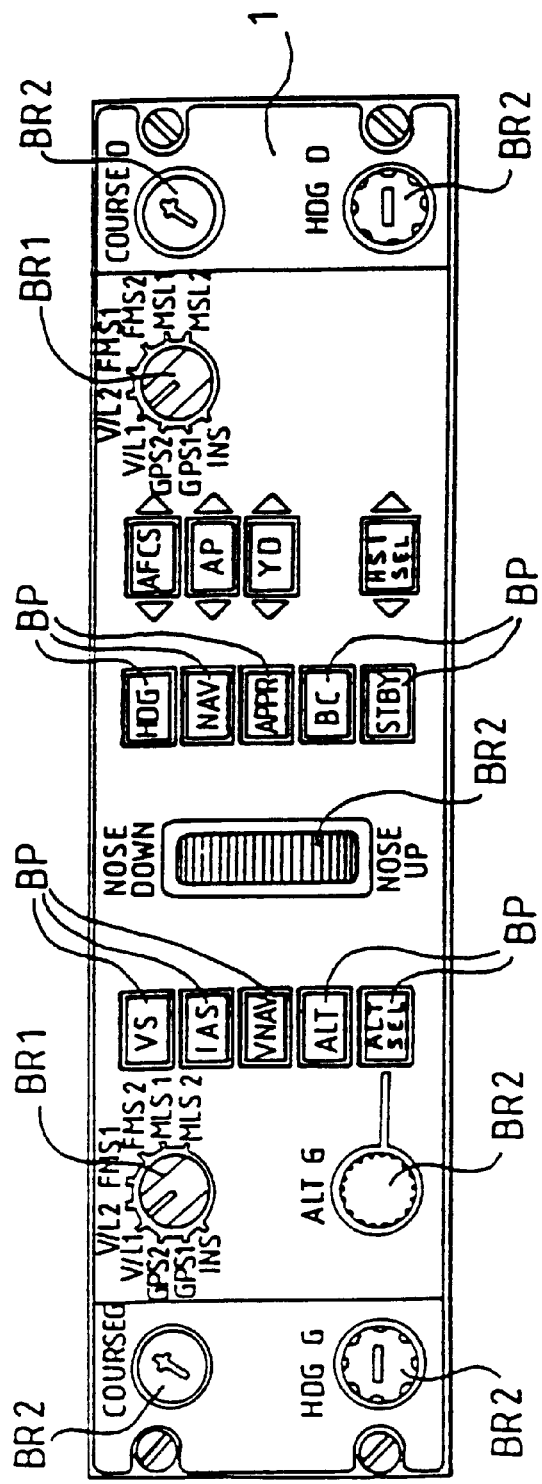
FIG. 5a a representation of a part of a control post such as the screen displays it.

Tests on certain electronic equipments EQ cannot take place in a totally automatic manner. Such is the case, for example, with the control posts of an aircraft, part of which is represented in FIG. 5a. To test such a post, the operator OP is driven by the test device DT.

The part 1 includes one or more modules such as two-position pushbuttons BP and/or rotary buttons BR1 which can take several marked positions, rotary buttons BR2 which can rotate on either side of a, generally central, position. These rotary buttons BR2 can be optical coders.

Such a test is made up of an alternation of commands invoking both the operator OP and the test device DT and of commands invoking only the test device DT. For example, a pilot control post test will begin with a command of the "SWITCH ON_CONTROL POST" type having as argument a parameter corresponding to the name of the control post and as variable the identifier of the equipment. This command calls up a manual action by the operator OP and also a measurement by the test device DT. The next command of the "DEADLINE" type imposes a deadline on the operator OP for performing the previous command, this deadline being counted down by the test device DT. The following commands prompting an intervention by the operator OP are of the "MANUAL ACTION" type. Their arguments specify the setting which the operator must give to this or that module BP, BR1, BR2 of the post. This command type also prompts a measurement by the test device DT.

FIG. 5b partially illustrates a test chart relating to a test of the part of the control post 1 illustrated in FIG. 5a. The cells relating to the result of the comparison are not represented.

Between each command type invoking the operator there is a command type imposing a deadline on the operator.

The commands of "DEADLINE" type have as argument the value of the deadline which in the example of FIG. 5b is 200 ms. The expected result of a command of manual action type is generally a voltage value or a voltage range required to appear in a determined position when the module takes the setting indicated in the label of the command.

The last command invoking the operator is the switching off of the control post and this command is followed by the compliance with a deadline within which the operator must act.

Before the start of the execution of such a test, the screen E of the test device DT displays a representation, such as that of FIG. 5a, of the control post to be tested.

In the course of the test, the test device DT drives the operator OP by indicating to him/her how and when to actuate the various modules BR1, BR2, BP of the control post. The test device DT includes means for signalling to the operator the intervention to be carried out by depicting it on the representation.

The various modules BP, BR1, BR2 will appear in turn on the screen E in a particular setting and the operator OP will have the deadline mentioned in the command to act.

The test device DT executes a measurement on expiry of the deadline imposed on the operator then it indicates to him/her a new action to be undertaken.

It is advantageous for the module to be actuated BP, BR1, BR2 to appear clearly on the screen E of the console IV highlighted or in colour, for example, so as to facilitate the task of the operator.

After the operator OP switches off the control post, the representation of the control post disappears and the test instruction chart FOT corresponding to the test just performed appears on the screen E with the actual results and the results of the comparisons. The detection of any defective test steps can be carried out.

What is claimed is:

1. A process for testing an electronic equipment linked to a computer coupled to a data entry and display console with a screen effecting an interface with an operator, according to a test comprising a list of commands to be executed, comprising:

displaying a test chart on said screen including several groups of cells, one group per command of said test;

accessing a dictionary containing a list of command types and for each type an associated label when a cell to be supplied with said command type is selected;

supplying said cell to be supplied with said command type;

causing said associated label to appear in said cell of the group to be supplied with said label; and displaying on said screen, after execution of said command, said actual result and said result of said comparison, wherein an associated group for at least one command includes:
- a cell supplied with a type of said command,
- a cell supplied with a label of said command, said label being associated with said type of said command, and said label having a syntax to be complied with and including at least one argument having to be completed by said operator,
- a cell supplied with an expected result of said command,
- a cell reserved for an actual result of said command, and
- a cell reserved for a result of a comparison between said actual result and said expected result.

2. The test process according to claim 1, wherein said label includes at least one argument of a parameter type, independent of said electronic equipment to be tested, and of a variable type, dependent on said electronic equipment to be tested.

3. The test process according to claim 2, further comprising:

accessing at least one database when said cell supplied with said command label and having said argument of variable type is selected, wherein said database is configured to associate said argument with values said argument can take.

4. The test process according to claim 3, wherein said values of said argument of said variable type are expressed differently according to an identifier chosen by said operator.

5. The test process according to claim 1, further comprising saving contents of said cells of said group after execution of said command.

6. The test process according to claim 5, further comprising processing said contents of said cells of said group after being saved.

7. The test process according to claim 1, further comprising:

numbering said commands of said test, wherein said group of cells associated with said command further includes a cell supplied with a step of said command.

8. The test process according to claim 1, further comprising executing all of said commands of said test regardless of said result of said comparison.

9. The test process according to claim 1, further comprising accessing at least one complementary test contained in a library configured to contain complementary tests when there is a difference between said actual result and said expected result of said command.

10. The test process according to claim 1, further comprising:

accessing a fault-locating database configured to group together saved commands related to electronic equipments previously tested of which at least one zone exhibited a defect; and establishing a link between said zone that exhibited said defect and at least one command for which a difference exists between said actual result and said expected result.

11. The test process according to claim 1, further comprising:

displaying on said screen a representation of at least one part of said equipment to be tested when an intervention by said operator is necessary to carry out said test; and signaling to said operator said intervention to be carried out by depicting said intervention on said representation.

12. A test device comprising:

a computer linked to an electronic equipment; and a data entry and display console with a screen effecting an interface with an operator, wherein said computer tests according to a test comprising a list of commands to be executed, said screen displaying a test chart made up of several groups of cells, one group per command of said test, said group of cells of at least one command including:
- a cell supplied with a type of said command,
- a cell supplied with a label of said command, said label having a syntax to be complied with and including at least one argument having to be completed by said operator,
- a cell supplied with an expected result of said command,
- a cell reserved for an actual result of said command, and
- a cell reserved for a result of a comparison between said actual result and said expected result, wherein said computer comprises:
- a dictionary containing a list of command types, wherein a label is associated with each of said command types to supply said cell supplied with said type of said command,
- means for displaying on said screen said label in said cell supplied with said label when said type of said command is supplied, and
- means for displaying on said screen said actual result and said result of said comparison when execution of said command is complete.

13. The test device according to claim 12, further comprising at least one database for grouping together values which a variable can take.

14. The test device according to claim 13, wherein said database contains said values of said variable, and wherein said values are expressed differently according to an identifier to be chosen by said operator.

15. The test device according to claim 12, further comprising at least one database for saving contents of said cells of said group after execution of said command.

16. The test device according to claim 15, further comprising means for processing contents of said cells of said group after being saved.

17. The test device according to claim 12, wherein said group of cells associated with said command further includes a cell supplied with a step allocated to said command.

18. The test device according to claim 12, further comprising a library containing complementary tests used when a difference exists between said actual result and said expected result of said command.

19. The test device according to claim 12, further comprising a fault-locating database used when a difference exists between said actual result and said expected result of said command, said fault-locating database grouping together saved commands related to previously tested electronic equipments of which at least one zone exhibited a defect, and to establish a link between said zone that exhibited said defect and at least one command for which a difference exists between said actual result and said expected result.

20. The test device according to claim 12, further comprising:

means for displaying on said screen a representation of at least one part of said equipment to be tested when intervention by said operator is necessary to carry out said test; and means for signaling to said operator said intervention to be carried out by depicting said intervention on said representation.

21. The test device according to claim 12, further comprising a test editor including at least one dialogue window including a dropdown menu configured to aid supplying of at least one cell of said group.

22. A test device comprising:

a computer linked to an electronic equipment; and a data entry and display console with a screen effecting an interface with an operator, wherein said computer tests according to a test comprising a list of commands to be executed, said screen configured to display a test chart made up of several groups of cells, one group per command of sadid test, said group of cells of at least one command including:

a cell supplied with a type of said command, a cell supplied with a label of said command, said label having a syntax to be complied with and including at least one argument having to be completed by said operator, a cell supplied with an expected result of said command, a cell reserved for an actual result of said command, and a cell reserved for a result of a comparison between said actual result and said expected result, wherein said computer comprises:

a dictionary containing a list of command types, wherein a label is associated with each of said command types to supply the said supplied with said type of said command;

a cell configured to display said label on said screen when said type of said command is supplied; and a first and second cell configured to display said actual result and said result of said comparison on said screen when execution of said command is complete.

23. The test device according to claim 22, further comprising at least one database configured to group together values which a variable can take.

24. The test device according to claim 23, wherein said database contains said values of said variable, and wherein said values are expressed differently according to an identifier to be chosen by said operator.

25. The test device according to claim 22, further comprising at least one database configured to save contents of said cells of said group after said execution of said command.

26. The test device according to claim 25, further comprising a processing unit configured to process contents of said cells of said group after being saved.

27. The test device according to claim 22, wherein said group of cells associated with said command further includes a cell supplied with a step allocated to said command.

28. The test device according to claim 22, further comprising a library configured to contain complementary tests used when a difference exists between said actual result and said expected result of said command.

29. The test device according to claim 22, further comprising a fault-locating database used, when a difference exists between said actual result and said expected result of said command, said fault-locating database configured to group together saved commands related to previously tested electronic equipments of which at least one zone exhibited a defect, and to establish a link between said zone that exhibited said defect and at least one command for which a difference exists between said actual result and said expected result.

30. The test device according to claim 22, further comprising:

a display unit configured to display on said screen a representation of at least one part of said equipment to be tested when intervention by said operator is necessary to carry out said test; and a signaling unit configured to signal to said operator said intervention to be carried out by depicting said intervention on said representation.

31. The test device according to claim 22, further comprising a test editor including at least one dialogue window including a dropdown menu configured to aid supplying of at least one cell of said group.

* * * * *